United States Patent [19]

Winzer et al.

[11] Patent Number: 4,860,294
[45] Date of Patent: Aug. 22, 1989

[54] INTEGRATED-OPTICAL ARRANGEMENT FOR BIDIRECTIONAL OPTICAL MESSAGE OR SIGNAL TRANSMISSION

[75] Inventors: Gerhard Winzer, Putzbrunn; Reinhard Maerz; Lothar Stoll, both of Munich, all of Fed. Rep. of Germany

[73] Assignee: Siemens Aktiengesellschaft, Berlin and Munich, Fed. Rep. of Germany

[21] Appl. No.: 173,718

[22] Filed: Mar. 25, 1988

[30] Foreign Application Priority Data

Mar. 30, 1987 [DE] Fed. Rep. of Germany ....... 3710549

[51] Int. Cl.$^4$ .............................................. H01S 3/19
[52] U.S. Cl. ............................................ 372/7; 372/50;
350/96.12; 350/96.17; 350/96.19
[58] Field of Search .................. 372/7, 50; 350/96.11,
350/96.12, 96.15, 96.17, 96.19

[56] References Cited

U.S. PATENT DOCUMENTS

| | | | |
|---|---|---|---|
| 4,136,928 | 1/1979 | Logan et al. .......................... | 372/50 |
| 4,286,838 | 9/1981 | Huignard et al. ................. | 350/96.11 |
| 4,640,574 | 2/1987 | Unger ................................ | 350/96.11 |
| 4,730,330 | 3/1988 | Plihal et al. .......................... | 372/50 |
| 4,760,569 | 7/1988 | Mahlein .............................. | 350/96.11 |
| 4,790,614 | 12/1988 | Imoto et al. ...................... | 350/96.12 |
| 4,815,081 | 3/1989 | Mahlein ................................ | 372/7 |

Primary Examiner—William L. Sikes
Assistant Examiner—Xuan Thi Vo
Attorney, Agent, or Firm—Hill, Van Santen, Steadman & Simpson

[57] ABSTRACT

An integrated optical arrangement for bidirectional optical message and signal transmission characterized by a common substrate having integrated thereon, a semiconductor laser, an optical detector and a direction selective coupling arrangement which coupling arrangement has a first port coupled to the laser, a second port coupled to the detector and a third port arranged for coupling light in and out of the arrangement with a first wavelength from the laser passing from the first port to the third port and the third port passing a second wavelength to the second port for detection. The arrangement further includes a wavelength selective filter being disposed in a waveguide extending to the second port for blocking light of the first wavelength but being transmissive to light of the second wavelength. The coupling arrangement can either be an optical directional coupler or a y-shaped waveguide fork.

19 Claims, 4 Drawing Sheets

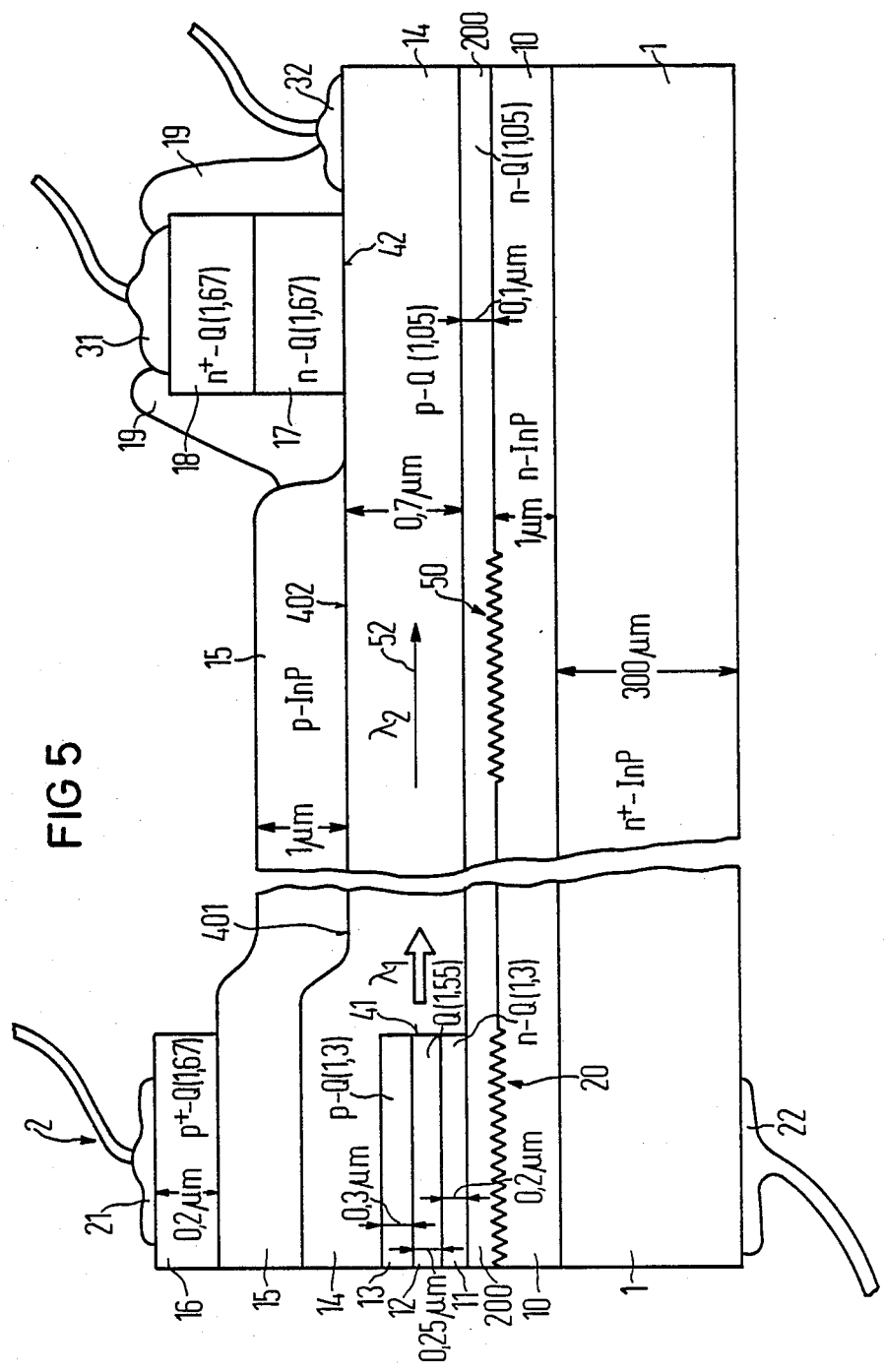

INTEGRATED-OPTICAL ARRANGEMENT FOR BIDIRECTIONAL OPTICAL MESSAGE OR SIGNAL TRANSMISSION

The present invention is directed to an integrated-optical arrangement for bidirectional optical message and signal transmission which includes a semiconductor laser, an optical detector, and direction-selective coupling means comprising a waveguide structure being integrated on a common substrate with the coupling means or arrangement comprising three ports with the first port being coupled to the laser, a second port being coupled to the detector and the third port positioned to transmit radiation to and receive radiation from an optical waveguide with the output of laser being passed from the first port to the third port and with an insignificant amount being transmitted to the second port and with another wavelength coupled into the third port being transmitted to the second port and detector.

U.S. Pat. No. 4,730,330, which claimed priority from a German Published Application 35 00 327 and who disclosure is incorporated herein, discloses an arrangement having a laser, a detector and an optical coupling means on a substrate. In the known arrangement a direction-selective coupling means is essentially composed of a Bragg grating fashioned on the waveguide structure and this Bragg grating is designed so that it allows a one wavelength $\lambda_1$ which is emitted by the laser and coupled into the waveguide structure at a first port to pass through to a third port and deflects another wavelength $\lambda_2$ coupled into the waveguide structure at the third port, to be passed to the detector arranged at the second port. The waveguide structure can be composed of a film waveguide or a T-shaped strip waveguide structure. The known arrangement is suitable for a small channel spacing with a channel spacing of less than 50 nm.

SUMMARY OF THE INVENTION

The object of the present invention is to provide a new design of an arrangement of integrated optical arrangement that is suitable for a small channel spacing and with which a cross-talk attenuation of at least 45 dB can be achieved.

This object is achieved in an improvement in integrated optical arrangement for bidirectional optical message and signal transmission, said arrangement having a semiconductor laser, an optical detector and a direction-selective coupling means comprising a waveguide structure being integrated on a common substrate, said coupling means comprising three ports having a first port coupled to the laser, second port being coupled to the detector and a third port being arranged to emit radiation to a optical waveguide and to receive radiation from the optical waveguide with the ports being arranged so that a first wavelength from the lasers coupled into the first port is transmitted to the third port of the three ports and is not at least significantly transmitted into the second port and that another or second wavelength coupled into the third port is transmitted to the second port and the detector. The improvements are that the coupling means is constructed so that light of a first wavelength from the laser is transmitted directly between the first port to the third port and a second wavelength is transmitted between the third port and the second port and that a wavelength selective filter is arranged on the waveguide leading to the second port and detector with said length selective filter blocking the first wavelength and being transmissive for radiation of the second wavelength. Preferably, the coupling means is composed of either a Y-shaped waveguide fork which has one fork branch allocated the first port, a second fork branch allocated the second port and the fork stem allocated to the third port or an optical directional coupler which has two ports on one side of the coupling path with one of the two ports forming the first port and the other forming the second port and the third port being on the other side of the coupling path from the first and second ports.

In the arrangement of the invention, the demanded cross-talk attenuation, which is also required for practice, is achieved first by exploiting the directional selectivity of the waveguide fork or respectively the directional coupler and by the filter effect of the wavelength-selective filter that enables employment of the arrangement for transmission at a small channel spacing.

It is especially advantageous when the arrangement can be manufactured at both sides of a transmission path in a uniform technology. It can therefore be manufactured with the technology of integrated optics and is suitable for optical fiber transmission paths in the subscriber terminal region.

The third port of the coupling means of the invention is usually defined by an end face of a strip waveguide at which a high change in refractive index is present. In this case, it is important to design the arrangement of the invention with an end face forming the third port being coated so that only a small portion of the light is reflected at the end face and this portion lies in an order magnitude of 1/10 of 1%. Thus, the intensity of the light of the first wavelength $\lambda_1$ emitted by the laser is higher by a multiple than the intensity of the light of the other or second wavelength $\lambda_2$ which is supplied through a long transmission path and is attenuated by the long transmission path. The intensity of the portion of the light of the first wavelength $\lambda_1$ reflected by the uncoated end face will still potentially be a multiple greater than the intensity of the light of the second wavelength $\lambda_2$ supplied via the transmission path. Thus the reflected part of the light of the one wavelength $\lambda_1$ proceeding both back into the laser as well as into the wavelength-selective filter that screens the photodetector from the light of the laser will be greatly reduced.

At least with the reference to the second wavelength $\lambda_2$ supplied to the third port in view of the part that is supplied to the wavelength selective filter and to the detector, a waveguide fork and an optical directional coupler cause a loss of 3 dB at least when identical waveguides and symmetrical format are used. This loss, for example, can be diminished by an asymmetrical format, for example, if the first fork branch of the waveguide fork is made smaller in cross-section than the fork stem and the second fork branch extending to the detector.

The loss upon employment of an optical directional coupler can be diminished to an even greater degree than in a waveguide fork when this directional coupler is a wavelength-selective directional coupler that is constructed so that the first wavelength $\lambda_1$ and not or only insignificantly the other wavelength $\lambda_2$ is transmitted between the first port and the second port through a coupling path and the other wavelength $\lambda_2$ and not or at least insignificantly the first wavelength $\lambda_1$ is transmitted between the third port and the second port. Thus the wavelengths activity is merely used in order to achieve a reduction of the losses. In comparison to highly selected modification, the directional coupler can be thereby executed considerably shorter because suppression of the cross-talk occurs in the wavelength-selective filter.

A preferred embodiment of the directional coupler comprises a waveguide proceeding in a straight line in the coupling path between the first port and the third port of the coupling means and the second waveguide arranged in the coupling path at a slight distance from the first waveguide proceeding straight therein and said second coupling path having a wave shape structure in the coupling path and leading to the second port.

With respect to the Y-shaped waveguide fork, let it be pointed out that this is not to be interpreted such that the fork dare comprise only two fork branches. The fork can also comprise more than two fork branches. The only thing critical is that the two fork branches are present and therefore one is allocated to the first port and the other is allocated to the second port and these unite with a fork stem in a fork root.

In the special preferred embodiment of the arrangement of the invention, as the wavelength-selective filter is composed of a Bragg grating fashioned at the waveguide leading to the detector.

Preferred developments of the arrangement of the wavelength selective filter has the Bragg grating being at least one grating line that proceeds perpendicular to the propagation direction of the light guided in the waveguide leading to the director. The Bragg grating is arranged on either fork branch of the waveguide fork that leads to the second port or is fashioned on the second waveguide of the directional coupler outside of the coupling path.

Since the Bragg grating is not tuned to the other or second wavelength $\lambda_2$ but is tuned to the first wavelength $\lambda_1$ of the laser that is situated on the same substrate, polarization-independent components are not needed because the laser resonates only the TE polarization. Over and above this, this development or arrangement offers the advantage that the modules for the transmission path can be freely combined in the defined region. The smallest possible space being of the wavelength $\lambda_1$ and $\lambda_2$ is thereby determined by the width of the stop band of the Bragg grating. The possible wavelength spacing towards the top are limited by a commencement of the emission of the Bragg grating at the short wave side.

In a development of the arrangement that is especially advantageous that the laser is a distributed feedback (DFB) laser having an optical grating. The optical grating of the laser and the Bragg grating are constructed on a common layer on or positioned over the substrate. With the manufacture of the arrangement of the invention by epitaxy, a common layer can be an epitaxial layer and the two gratings can be manufactured without an intervening epitaxy, so that the number of process steps required can be noticeably reduced.

A further development of this arrangement is that the grating for the laser and the Bragg grating are composed of a single grating whose grating line diverge fan shape from the grating for the laser in the direction of the Bragg grating. Thus the two necessary gratings can be manufactured in a single method step. A preferred and advantageous development of the arrangement has the fan shape single grating being fashioned on a buffer layer that separates the substrate from a layer which contains or forms the waveguide of the arrangement and the laser active layer of the laser is arranged above its grating. It is particularly desireable when an intermediate layer is provided between the layer structure of the laser and the grating forming the grating for the laser and the Bragg grating of the waveguide. The intermediate layer is introduced so that the Bragg grating used as a filter need not be epitaxially over-grown again after the etching of the laser structure.

Other advantages, and features of the invention are readily apparent from the following description of the preferred embodiments, the drawings and the claims.

BRIEF DESCRIPTION OF THE DRAWINGS

FIG. 5 is a cross-sectional view through the arrangement of FIG. 4 with the left half of FIG. 5 being taken along lines C—C of FIG. 4 and the right half of FIG. 5 being along the lines D—D of FIG. 4.

DESCRIPTION OF THE PREFERRED EMBODIMENTS

Figure 1:
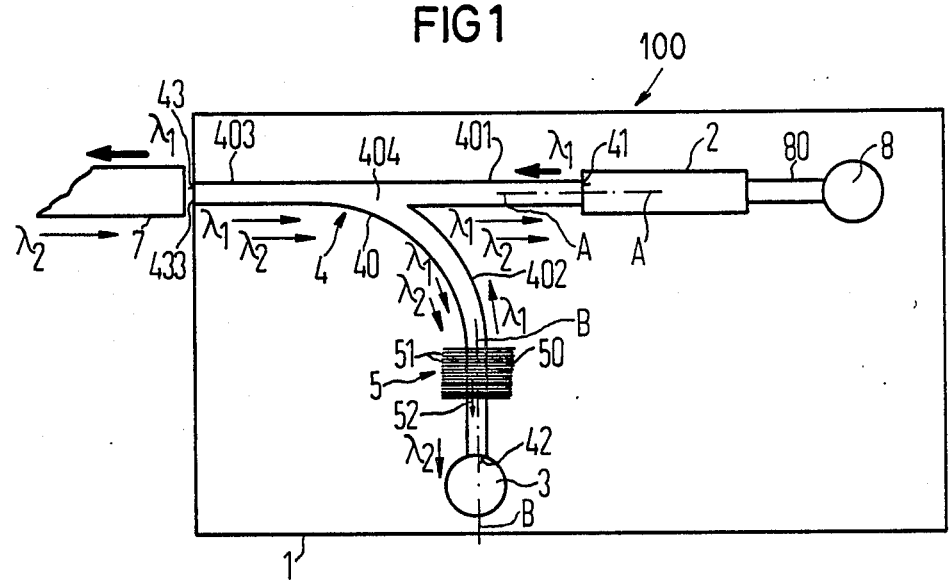
FIG. 1 is a plan view of an arrangement comprising a waveguide fork as a directional-selective coupling means in accordance with the present invention.

The principles of the present invention are particularly useful when incorporated in the arrangement generally indicated at 100 in FIG. 1. The arrangement 100 has a substrate 1. A semiconductor laser 2, an optical detector 3, a directional selective optical coupling means 4, a wavelength selective filter 5 and a monitor diode 8 are integrated onto the common substrate 1. As illustrated, the direction-selective, optical coupling means 4 is a waveguide fork 40 and the wavelength-selective filter 5 is a Bragg grating 50. The diode 8 is for monitoring the output power of the laser 2.

The waveguide fork 40 is constructed as a strip-waveguide which has a first fork branch 401 leading from a first port 41 at the laser 2 to a fork root 404 and a fork stem 403 leading from the fork branch 401 to a third port 43. The fork branch 401 and the stem 403 form a through-straight line strip waveguide. A second or other fork branch 402, which leads to a second port 42 at detector 3, is composed of a strip waveguide which branches off of the fork root 404 and proceeds along a curved path. The Bragg grating 50 is formed on the surface of the strip waveguide 402 by etching or some other way.

The third port 43 of the waveguide fork 40 is defined by an end face 433 of the straight strip waveguide 401, 403 at the end of the fork stem 403. A transmission fiber 7 is coupled to this end face 433 and the one or first wavelength $\lambda_1$ emitted by the semiconductor laser 2 and conducted via the port 41 into the straight strip waveguide 401–403, to the third port 43 is forwarded into this transmission fiber 7 as indicated by the arrows.

A second or other wavelength $\lambda_2$ which is supplied from the fiber 7 to the arrangement 100 and is coupled into the fork stem 403 via the third port 43 and just like a part of the light of the first wavelength $\lambda_1$ reflected at the end face 43 propagates therein in the direction towards the fork root 404 where an intensity division of such a nature occurs that one part of the intensity of both wavelengths propagates in the one fork branch 401 to the first port 41 and the other part, which is technically about a half, propagates in the other fork branch 402 to the Bragg grating 50.

The Bragg grating 50 has parallel extending lines 51 that extend perpendicular to a light direction indicated by arrow 52 in the waveguide adjacent to the second port 42, the grating 50 is dimensioned so that the one or first wavelength $\lambda_1$ is reflected by it and is propagated back in the fork branch 402 to the root 404 and from the root 404 back to the third port 43. The second wavelength $\lambda_2$ is allowed to pass to the second port 42 where it is coupled out to the detector 3 and then can be detected.

The light or radiation of the first wavelength $\lambda_1$ emitted by the laser 2 and proceeding to the third port 43 usually has a far greater intensity then the light of the second wavelength $\lambda_2$ that is conducted through the fiber 7 to the third port 43 because this light of the second wavelength usually arrives greatly attenuated during its movement along the transmission path. Since the end face 433 comprises a very pronounced change in the refractive index and a great part of the light of the first wavelength $\lambda_1$ is reflected at this end face 433, this end face 433 must be coated in a high quality fashion so that the intensity of the reflected part of the light of the third wavelength lies at least on the order of magnitude of the radiation of the second wavelength $\lambda_2$. It can be recited as a guide line that the maximum fraction of the light of the first wavelength $\lambda_1$ that dare be reflected at the end face 433 lie in the order of magnitude of 1/10 of 1%.

The monitoring detector 8 is arranged on the side of the semiconductor laser 2 facing away from the first port 41 and is connected to the semiconductor laser 2 by a short section of strip waveguide 80. The detector 3 and the monitor detector 8 can each be photodiodes.

Figure 2:
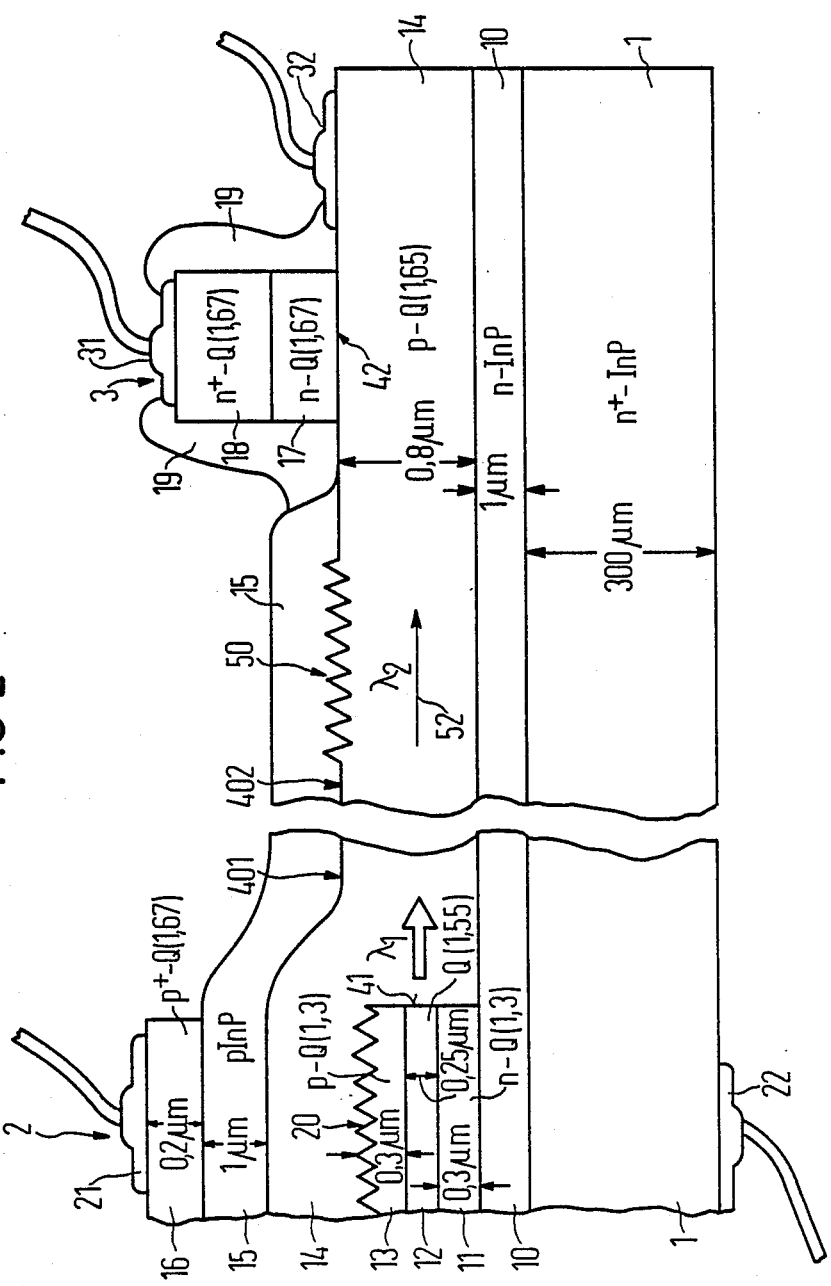
FIG. 2 is a vertical cross-sectional view of the arrangement of FIG. 1 with the left half of FIG. 2 being taken along line A—A of FIG. 1 and the right half of FIG. 2 taken along the lines B—B of FIG. 1.

FIG. 2 shows vertical sections through a specific exemplary embodiment of the arrangement of FIG. 1 with only parts of the vertical section of interest being illustrated in view of the manufacturing of the device and of the coupling of the waveguide fork 40 to the semiconductor laser 2 and to the detector 3 as well as the construction of the Bragg grating 50. These are the two vertical sections along the regions of sections lines A—A and B—B with that portion along line A—A being a left hand part of FIG. 2 while that belonging to the portion B—B being on the right hand portion of FIG. 2.

In the exemplary embodiment of FIG. 2, an epitaxial buffer layer 10 of n-doped InP and of a thickness of 1 $\mu$m is applied to an n+-doped substrate 1 of InP having a thickness of 300 $\mu$m and an epitaxial layer 14 of p-doped, quaternary material having a gap wavelength of 1.05 $\mu$m and a thickness of 0.8 $\mu$m are applied to this buffer layer 10. A further p-doped epitaxial layer 15 having a thickness of 1 $\mu$m is situated on the layer 14.

The distributed feedback (DFB) laser 2 is situated at the left part of FIG. 2 and is essentially formed by a layer stack of three layers 11, 12 and 13 with the layer 13 having the Bragg grating 20 of the laser. The stack of three layers 11, 12 and 13 is arranged region-by-region between the layer 10 and the layer 14.

Of the three layers 11, 12 and 13, which are likewise epitaxial layers, the layer 11 is applied directly on the layer 10 and is composed of n-doped, quaternary material having a gap wavelength of 1.3 $\mu$m and a thickness of 0.3 $\mu$m. The layer 12, which forms the laser active layer and is composed of undoped quaternary material having a gap wavelength of 1.55 $\mu$m and a thickness of 0.25 $\mu$m, is applied on the layer 11. The layer 13, which is composed of p-doped quaternary material and has a gap wavelength of 1.3 $\mu$m and a thickness of 0.3 $\mu$m and an whose surface the Bragg grating 20 is etched, is applied on the layer 12. The layers 11, 12 and 13 and the grating 20 are manufactured before applying the layer 14.

For completing the laser diode, a p+-doped quaternary layer 16 having a gap wavelength of 1.67 $\mu$m and a thickness of 0.1 $\mu$m is applied on the layer 15 over the region of the stack containing the three layers 11, 12 and 13. This p+-doped quaternary layer is contacted with a contact 21. The cooperating contact 22 is applied to the underside of the substrate 1 below the stack of three layers 11, 12 and 13. The light of the one or first wavelength $\lambda_1$ emitted by the laser 2 emerges from the end face of the layer 12 and passes from one of these two end faces directly into the layer 14 which forms or contains the waveguide fork 40. Accordingly, this end face also forms the first port 41 of the waveguide fork 40.

The detector 3 which is situated on the right hand part of FIG. 2 is composed of a photodiode that essentially comprises the layer 14, a n-doped quaternary layer 17 having a gap wavelength of 1.67 $\mu$m applied thereon and an n+-doped quaternary layer 18 having the same gap wavelength of 1.67 $\mu$m applied to this latter layer. Of the two contacts of the diode 3, the contact 31 is applied on the layer 18 and the other contact 32 is applied on the p-doped layer 14, which forms or contains the other fork branch 402 of the waveguide fork 40 as a strip waveguide in the right hand part of FIG. 2. For example, the strip waveguides of the waveguide fork 40 can be etched out from the layer 14 as a rib waveguides. A passivating layer 19 is applied to surround the diode 3 and, for example, can be composed of silicon nitride. The second port 42 is formed by the boundary surface between the layer 17 and the layer 14.

Figure 3:
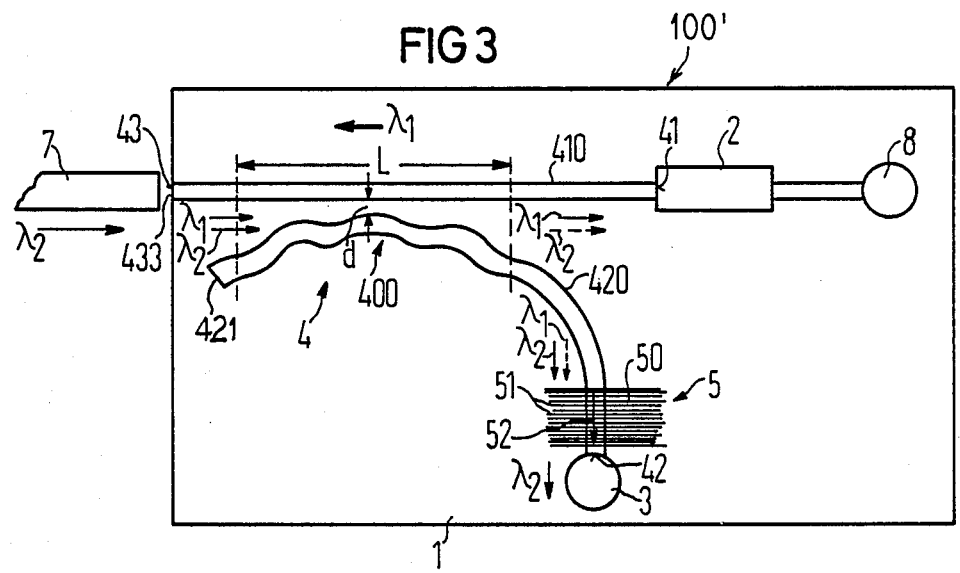
FIG. 3 is a plan view of the arrangement of the present invention utilizing a wavelength selective optical directional coupler as the directional-selective coupling means.

An embodiment of the arrangement is generally indicated at 100' in FIG. 3. This embodiment 100' differs from the embodiment 100 of FIGS. 1 and 2 in that a directional coupler 400 having a coupling path L is used instead of the waveguide fork 40.

The directional coupler 400 is composed of a straight strip waveguide 410 proceeding between a first port 41 and a third port 43 and of a second waveguide 420 which is arranged in the coupling path a slight distance d from the waveguide 410. This second waveguide 420 proceeds in the waveshape or curve configuration in the region of the coupling path L and has a curve portion extending to the second port 42. The section of the second waveguide 420 on which the Bragg grating 50 is applied and which proceeds outside of the coupling path corresponds to the second or other fork branch 402 of the waveguide fork 40 in the embodiment 100 of FIGS. 1 and 2. The waveguide 420 has an opposite or other end 421 which is situated on the left hand side of the coupling path L and is shielded from light entrance from the outside. The directional coupler 400 acts as a wave-selective directional coupler because the first wavelength $\lambda_1$ is essentially transmitted only from the port 41 and 43 and the second wavelength $\lambda_2$ is essentially transmitted only between the ports 43 to port 42. Losses of the coupler are thereby considerably reduced. As in the embodiment 100 of FIGS. 1 and 2, the grating 50 is formed of grating lines 51 which extend parallel to each other and perpendicular to the direction 52 of the light travelling in the waveguide and going to the second port 42. Thus, the grating lines 51 are also perpendicular to that portion of the waveguide 420 adjacent the port 42. The remaining construction such as the monitoring diode 8 for the laser and the construction of the waveguides are the same as in the embodiment of FIGS. 1 and 2.

Figure 4:
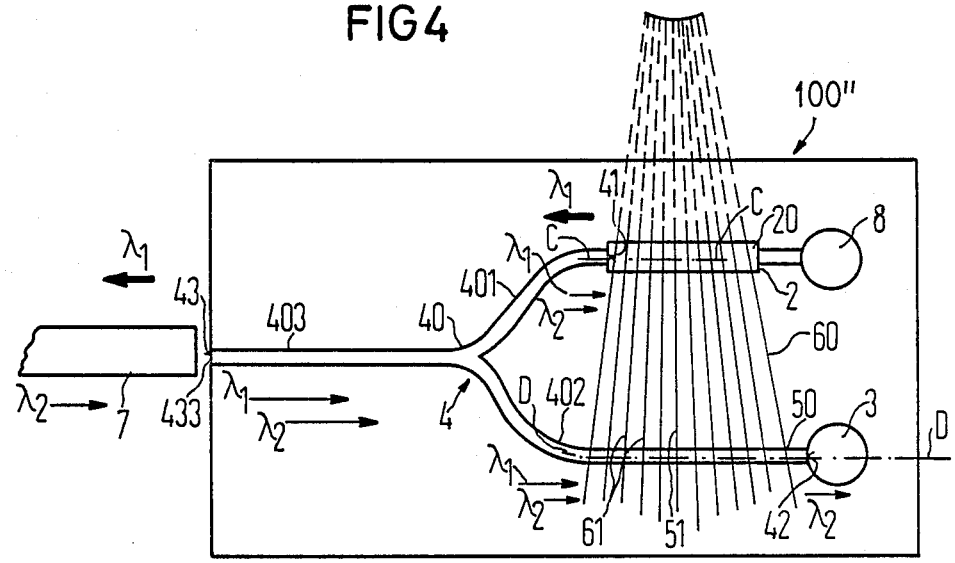
FIG. 4 is a plan view of the arrangement according to the present invention where the two gratings are composed of the single, fan-shaped grating that is applied on an epitaxial layer.

A third embodiment of the arrangement is generally indicated 100" in FIG. 4. As illustrated in FIGS. 4 and 5, the embodiment differs from the embodiment 100 of FIGS. 1 and 2 essentially in that the Bragg grating 20 of the laser and the Bragg grating 50 which forms the wavelength-selective filter 5 are constructed on a common buffer layer 10 that separates the substrate 1 from the layer 14. (See FIG. 5). The Bragg grating 20 of the laser 2 in this case is situated under the stack of three layer 11, 12, 13 of the laser. Over and above this, the grating 20 of the laser 2 and the Bragg grating 50 are composed of a single grating 60 whose grating lines 51 and 61 diverge fan-shape from the grating 20 in the direction to the Bragg grating 50. As a result thereof, the two gratings 20 and 50 can be manufactured in the single method step.

In the arrangement 100", the two fork branches 401 and 402 of the waveguide fork proceed parallel to one another in the region of the two gratings 20 and 50. Instead of the waveguide fork 40, a directional coupler, for example, a directional coupler 400 of FIG. 3 could be used.

An intermediate or additional, n-doped quaternary layer 200 (FIG. 5) having the gap wavelength 1.05 $\mu$m and a thickness of 0.1 $\mu$m is provided so that the Bragg grating 50 need not be epitaxially over-grown after the layers 11, 12 and 13 of the laser 2 have been etched. Otherwise, the arrangement of FIGS. 4 and 5 correspond to the arrangement of FIGS. 1 and 2.

It should be noted that the quaternary layer is referred with reference Q in FIGS. 2 and 5. The gap wavelength which defines the refractive index of the particular quaternary layer Q is indicated in brackets. In addition, the doping is recited in these FIGS. wherein n+ indicates a relatively high doping.

An arrangement having the dimension cited in FIG. 2 and 5 allows one to expect a stop band width of 1-2 nm and a wavelength spacing of 15-20 nm up to the beginning of the emission of the Bragg grating 50.

The numerical indications provided above and placed in the brackets of FIGS. 2 and 4 with respect to the gap wavelength means a wavelength in $\mu$m. Thus, for example, the gap wavelength of 1.05 $\mu$m for the layer 14 FIGS. 2 and 5 denotes a gap wavelength of 1.05 $\mu$m.

Although various minor modifications may be suggested by those versed in the art, it should be understood that we wish to employ within the scope of the patent granted hereon, all such modifications as reasonably and properly come within the scope of our contribution to the art.

We claim:

1. In an integrated optical arrangement for a bidirectional optical message and signal transmissions, said arrangement including a semiconductor laser for producing a first light of a first wavelength, an optical detector, and a direction-selective selective coupling means comprising a waveguide structure being integrated on a common substrate, said coupling means including three ports with a first port being coupled to the laser, a second port being coupled to the detector and the third port being positioned adjacent an edge of the substrate for coupling with a transmission line with the first light of the first wavelength being coupled from the laser into the first port to be transmitted by the structure to the third port with only an insignificant amount being transmitted into the second port and a second light of a second wavelength being coupled into the third port for transmission by the structure to the second port, the improvements comprising said structure of the coupling means being constructed with the first light of the first wavelength being transmitted through the coupling from the first port to the third port and the second light of the second wavelength being transmitted basically between the third port and the second port, said structure of the coupling means including a second waveguide extending to the second port and a wavelength-selective filter being arranged adjacent the second port on the second waveguide, said wavelength-selective filter blocking the first light of the first wavelength while being transmissive to the second light of the second wavelength.

2. In an integrated optical arrangement according to claim 1, wherein the coupling means is composed of a Y-shaped waveguide fork having one fork branch allocated to the first port, a second fork branch forming the second waveguide extending to the second port and a fork stem being allocated to the third port.

3. In an integrated optical arrangement according to claim 2, wherein an end face of the fork stem forms the third port and is coated so that the first light of the first wavelength reflected at the end face has a magnitude of 1/10 of 1%.

4. In an integrated optical arrangement according to claim 2, wherein the wavelength selective filter is composed of a Bragg grating fashioned on the second waveguide.

5. In an integrated optical arrangement according to claim 4, wherein the Bragg grating comprises at least one grating line that proceeds perpendicular to the direction of propagation of the light guided in the second waveguide.

6. In an integrated-optical arrangement according to claim 4, wherein the laser is a distributed feedback laser comprising an optical grating, said optical grating of the laser and the Bragg grating being constructed on a common layer of the arrangement on the substrate.

7. In an integrated-optical arrangement according to claim 6, wherein the grating of the laser and the Bragg grating on the second waveguide are formed by a single grating whose grating lines diverge fan-shape from the grating of the laser in the direction of the Bragg grating associated with the second waveguide.

8. In an integrated-optical arrangement according to claim 7, wherein the grating of the laser and the Bragg grating for the second waveguide are fashioned on a buffer layer that separates the substrate from a layer which forms the waveguides of the coupling means and the laser active layer of the laser is arranged above the grating on the buffer layer.

9. In an integrated-optical arrangement according to claim 8, which includes an intermediate layer which is provided between the laser active layer of the laser and the grating on the buffer layer.

10. In an integrated-optical arrangement according to claim 1, wherein the coupling means is composed of an optical directional coupler that has two ports on one side of the coupling path with one of the two ports forming the first port and the other forming the second port, said optical coupler having a third port on the other side of the coupling path and said optical directional coupling being fashioned so that the first light of the first wavelength is transmitted through the coupling path between the first and third ports and the second light is transmitted between the third port and the second port.

11. In an integrated-optical arrangement according to claim 10, wherein the third port is formed by an end face of a waveguide leading from the coupling path of the directional coupler, said end face being coated so at most only a fraction of the first light is reflected at the end face and has a magnitude of 1/10 of 1%.

12. In an integrated-optical arrangement according to claim 10, wherein the directional coupler is a wavelength selective directional coupler that is fashioned with the first light and not significantly the second light being transmitted between the first port and the third port through the coupling path and only the second light and not a part of the first light being transmitted between the third port and the second port.

13. In an integrated-optical arrangement according to claim 12, wherein the directional coupler comprises a first waveguide and the second waveguide, said first waveguide proceeding on a straight line in the coupling path and connecting the first port to the third port of the coupling means, said second waveguide having a first portion and a second portion, said first portion being arranged in the coupling path at a slight distance from the first waveguide and having a wave-shape configuration in the region of the coupling path, and the second portion leading to the second port.

14. An arrangement according to claim 10, wherein the wavelength-selective filter is composed of a Bragg grating constructed on the second waveguide leading to the second port.

15. In an integrated-optical arrangement according to claim 14 wherein the Bragg grating comprises at least one grating line that extends perpendicular to the propagation direction of the light guided in the second waveguide leading to the second port.

16. In an integrated-optical arrangement according to claim 14, wherein the Bragg grating is arranged on the second waveguide of the directional coupler outside of the coupling path.

17. In an integrated-optical arrangement according to claim 14, wherein the laser is a distributed feedback laser having an optical grating.

18. In an integrated-optical arrangement for bidirectional optical message and signal transmissions, said arrangement including a semiconductor laser for producing a first light of a first wavelength, an optical detector, and a direction-selective coupling means having a waveguide structure being integrated on a common substrate, said coupling means having three ports with a first port being coupled to the laser, a second port being coupled to a detector and a third port being arranged for coupling out a first light of a first wavelength which was transmitted from the laser through the first port of the waveguide structure to the third port, said third port receiving a second light of a second wavelength which is conducted by the waveguide structure from the third port to the second port and the detector, the improvement comprising the coupling means being composed of a Y-shaped waveguide fork having one fork branch being allocated to the first port and a second fork branch being allocated to the second port and a fork stem being allocated to the third port, and a wavelength selective filter being arranged on the second fork branch leading to the detector, said wavelength selective filter blocking the first light of the first wavelength but being transmissive to the second light of the second wavelength.

19. In an integrated-optical arrangement for bidirectional optical message and signal transmission, said arrangement including a semiconductor laser for producing first light of a first wavelength, an optical detector, and a direction-selective coupling means comprising a waveguide system being integrated on a common substrate, said coupling means comprising three ports with a first port being coupled to the laser, a second port being coupled to the detector and a third port being arranged for out coupling the first light of the first wavelength which was transmitted from the laser through the first port of the waveguide system to the third port and for coupling in a second light of a second wavelength for transmission by the waveguide system from the third port to the second port, the improvements comprising said coupling means being an optical directional coupler comprising two ports on one side of a coupling length with one of the two ports being the first port and the other being the second port, said optical directional coupler having a port on the other side of the coupling length comprising the third port, said optical directional coupler being constructed so that the first light of the first wavelength is transmitted through the coupling path between the first and third ports and the second light of the second wavelength is transmitted between the third and second ports, and a wave-selective filter being arranged on a waveguide leading to the second port and detector, said wavelength selective filter blocking the first light of the first wavelength but being transmissive for the second light of the second wavelength.

* * * * *